United States Patent [19]
Shigetaka et al.

[11] Patent Number: 5,869,790
[45] Date of Patent: Feb. 9, 1999

[54] COORDINATE INPUT APPARATUS HAVING ORTHOGONAL ELECTRODES ON OPPOSITE SURFACES OF A DIELECTRIC SUBSTRATE AND THROUGH-HOLE CONNECTIONS AND MANUFACTURING METHOD THEREOF

[75] Inventors: Hiroshi Shigetaka; Hideto Matsufusa; Ryuichi Hagiya; Naoki Yamada, all of Fukushima-ken, Japan

[73] Assignee: Alps Electric Co., Ltd., Tokyo, Japan

[21] Appl. No.: 684,236

[22] Filed: Jul. 24, 1996

[30] Foreign Application Priority Data

Aug. 16, 1995 [JP] Japan .................................. 7-210678
May 14, 1996 [JP] Japan .................................. 8-118959
May 14, 1996 [JP] Japan .................................. 8-118960

[51] Int. Cl.⁶ ........................ G08G 21/00; G09G 5/00
[52] U.S. Cl. ........................ 178/18.03; 178/18.01; 345/193; 345/174; 345/177
[58] Field of Search ........................ 345/173, 174, 345/176, 177, 178; 178/18.01, 18.02, 18.03, 18.04, 19.02, 19.04

[56] References Cited

U.S. PATENT DOCUMENTS

| | | | |
|---|---|---|---|
| 4,794,634 | 12/1988 | Torihata | 178/18 |
| 4,797,514 | 1/1989 | Talmage | 178/18 |
| 4,801,767 | 1/1989 | Sato | 178/18 |
| 4,801,771 | 1/1989 | Mizuguchi | 178/18 |
| 5,305,017 | 4/1994 | Gerpheide | 345/174 |

*Primary Examiner*—Vijay Shankar
*Attorney, Agent, or Firm*—Brinks Hofer Gilson & Lione

[57] ABSTRACT

A coordinate input apparatus has a film sensor substrate. An X electrode array having a plurality of electrodes in parallel to each other is disposed on the obverse surface of the sensor substrate. A Y electrode array having a plurality of electrodes in parallel to each other is disposed on the reverse surface of the sensor substrate in a direction orthogonal to the X electrode array. A first through hole is formed at one end of the X electrode array, while a first land is formed at one end of the Y electrode array. A second land is disposed on the sensor substrate so that it can be electrically connected to the first through hole.

14 Claims, 6 Drawing Sheets

COORDINATE INPUT APPARATUS HAVING ORTHOGONAL ELECTRODES ON OPPOSITE SURFACES OF A DIELECTRIC SUBSTRATE AND THROUGH-HOLE CONNECTIONS AND MANUFACTURING METHOD THEREOF

BACKGROUND OF THE INVENTION

1. Field of the Invention

The present invention relates to a coordinate input apparatus that outputs coordinate positional information by detecting a variation in capacitance caused by a touch of the operator's finger and designating the position indicated by the finger. The invention also relates to a manufacturing method of the apparatus.

2. Description of the Related Art

As a typical input apparatus for inputting graphics and character information, a coordinate input apparatus, which is referred to as "a tablet", is becoming widespread. In this coordinate input apparatus of the type which inputs a desired item of information by selecting characters or graphics indicated on the display screen, the following types have been put into practical use: a resistive type that detects a change in resistance as a switch operation caused by touching characters or graphics on the display with a finger tip, and a capacitive type that detects a change in capacitance between electrodes caused by a touch of a finger tip.

As an example of known coordinate input apparatuses of the capacitive type, a dielectric sensor substrate formed in a rectangular shape is placed on a circuit substrate, and these substrates are electrically connected to each other via flexible wiring substrates. Formed on the obverse surface of the sensor substrate is an array of a plurality of X electrodes disposed at a predetermined interval and extending in the X direction, and formed on the reverse surface thereof is an array of a plurality of Y electrodes disposed at a predetermined interval and extending in the Y direction. The same end of each of the X electrodes is used as a connecting portion, and the same end of each of the Y electrodes also serves as a connecting portion, a connector being mounted on each connecting portion. A flexible wiring substrate is connected at both ends to each connector and the circuit substrate so that the X and Y electrode arrays formed on the sensor substrate can be electrically connected to the circuit substrate via this wiring substrate.

In the coordinate input apparatus constructed as described above, the operator's finger tip is pressed against a desired position of the sensor substrate so that electric lines of force to travel to the Y electrodes from the X electrodes are partially absorbed into the finger, thus causing a change in the electric lines of force. The position of the finger can thus be detected based on this change in capacitance.

As described above, in the conventional capacitive coordinate input apparatus, the X and Y electrodes mounted on the obverse and reverse surfaces of the sensor substrate are electrically connected to the circuit substrate via flexible wiring substrates. It is thus necessary that connectors to be coupled to the X and Y electrodes, respectively, be attached to the obverse and reverse surfaces of the substrate. This inevitably increases the thickness of the overall apparatus by an amount equal to the connectors. Moreover, a flexible wiring substrate coupled to each connector inevitably projects outwardly from the lateral side of the sensor substrate in order to be guided to the circuit substrate. This increases the external dimensions of the overall apparatus.

Figure 13:
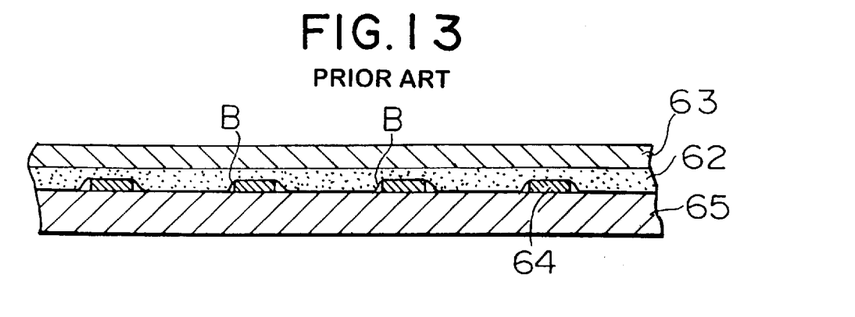
FIG. 13 is a sectional view of a sensor substrate illustrating the problems inherent in known arts.

Additionally, in the conventional capacitive coordinate input apparatus, a protective sheet provided with an acrylic resin-formed adhesive sheet on its reverse surface is attached onto the sensor substrate. However, it is difficult for the protective sheet, formed of a sheet member as small as 0.2 mm in thickness, to adhere to match the undulating surface of the sensor substrate. Accordingly, it is likely, as illustrated in FIG. 13, that numerous irregularly-shaped bubbles B are disadvantageously produced on the sensor substrate 65 due to the thickness of an X electrode 64 (from 7 to 10 $\mu$m) when the protective sheet 63 is attached onto the sensor substrate 65 via the adhesive layer 62. Air within the bubbles B trapped in the adhesive layer 62 produces an adverse influence on the capacitance. Thus, high precision cannot be easily achieved with the use of the conventional apparatus, for example, the linearity of the coordinate positions detected by the linear movement of a finger on the protective sheet 63 is significantly varied depending on which portion of the protective sheet 63 the finger contacts.

On the other hand, the protective sheet 63 with a reduced thickness is more likely to match the undulating surface of the sensor substrate 65. However, this only results in undulating the surface of the protective sheet 63 which serves as the operational surface. Consequently, the problem of variations in capacitance causing poor operational performance cannot be solved.

SUMMARY OF THE INVENTION

Accordingly, in view of the above background of the prior art, it is an object of the present invention to provide a slimmer and smaller coordinate input apparatus.

It is another object of the present invention to provide a coordinate input apparatus in which an electrical connection can be easily and positively established between a sensor substrate and a circuit substrate, and also to provide a manufacturing method of the apparatus.

In order to achieve the above objects, according to one aspect of the present invention, there is provided a coordinate input apparatus including a film sensor that comprises: a first electrode array having a plurality of electrodes disposed in parallel to each other on the obverse surface of the film sensor; a through hole section disposed at one end of the first electrode array; a second electrode array having a plurality of electrodes disposed in parallel to each other on the reverse surface of the film sensor in a direction orthogonal to the first electrode array; a first land section disposed at one end of the second electrode array; and a second land section electrically connected to the through hole section.

The above-described coordinate input apparatus may further comprise a circuit substrate having a wiring pattern to be connected to the first and second land sections, wherein the film sensor substrate may be placed on the circuit substrate.

According to another aspect of the present invention, there is provided a coordinate input apparatus comprising: a dielectric substrate including a first electrode array that has a plurality of electrodes disposed in parallel to each other on the obverse surface of the dielectric substrate, a second electrode array that has a plurality of electrodes disposed in parallel to each other on the reverse surface of the dielectric substrate in a direction orthogonal to the first electrode array, and a first through hole section disposed at one end of the first electrode array; a circuit substrate disposed adjacent to the reverse surface of the dielectric substrate, including a second through hole section positioned opposedly to face the first through hole section, a third through hole section located opposedly to face one end of the second electrode array, and a wiring pattern and a drive circuit disposed on the reverse surface of the circuit substrate and connected to the second and third through hole sections; and a connecting member for electrically connecting the first and second through hole sections and also electrically connecting the second electrode array and the third through hole section.

According to still another aspect of the present invention, there is provided a coordinate input apparatus in which a conductive material is applied to an opening passing through the sensor substrate and the circuit substrate, whereby the respective electrodes disposed on the obverse and reverse surfaces of the sensor substrate can be electrically connected via the conductive material to the circuit section mounted on the reverse surface of the circuit substrate. As a result, the apparatus can become slimmer and smaller.

According to a further aspect of the present invention, there is provided a method for manufacturing a slimmer and smaller coordinate input apparatus in which the conductive material is printed into and around the opening from the obverse surface of the sensor substrate while suction is applied to the opening from the reverse surface of the circuit substrate, thereby enhancing an easy and positive electrical connection between the electrode arrays and the circuit section via the conductive material.

According to a yet further aspect of the present invention, there is provided a method for manufacturing a slimmer and smaller coordinate input apparatus in which a filling layer may be disposed on the obverse surface of the sensor substrate in a region where the electrode array is not placed, or a gel-like adhesive may be disposed and cured between the sensor substrate and a protective sheet. This enables the protective sheet to adhere to the surface of the sensor substrate without trapping bubbles on the substrate, which would otherwise cause variations in capacitance. The flatness of the surface of the protective sheet can also be ensured.

As described above, according to the coordinate input apparatus of the present invention, the first electrode array disposed on the obverse surface of the film sensor substrate is communicated to the second land section formed on the reverse surface of the sensor substrate via the through hole section. Thus, outputs of both the electrode arrays respectively disposed on the obverse and reverse surfaces of the film sensor substrate can be transmitted to the circuit substrate through the reverse surface of the sensor substrate. This obviates the need for the provision of flexible wiring substrates and connectors, which are conventionally required for electrically connecting the film sensor substrate and the circuit substrate, which would otherwise cause flexible wiring substrates to project from the lateral sides of the film sensor substrate and the circuit substrate. This can simplify the structure of the film sensor substrate and further contribute to a slimmer and smaller coordinate input apparatus.

Also, a wiring pattern to be connected to the first and second land sections formed on the sensor substrate is mounted on the circuit substrate disposed adjacent to the reverse surface of the film sensor substrate. With this arrangement, the sensor substrate can be merely placed on the circuit substrate to electrically connect the two electrode arrays on the sensor substrate to the circuit substrate.

Further, the first electrode array mounted on the obverse surface of the sensor substrate is communicated to the reverse surface thereof via the associated through holes. Thus, the first electrode array, as well as the second electrode array disposed on the reverse surface of the sensor substrate, can be connected to the wiring pattern on the circuit substrate via a connecting member. This can establish a simple and secure connection between the film sensor substrate and circuit substrate, and also provides a slimmer and smaller coordinate input apparatus.

According to a further aspect of the present invention, there is provided a coordinate input apparatus comprising: a sensor substrate having a plurality of first electrodes disposed in parallel to each other on the obverse surface of the sensor substrate, a plurality of second electrodes disposed in parallel to each other on the reverse surface of the sensor substrate in a direction orthogonal to the plurality of first electrodes, and a through hole disposed at one end of each of the plurality of first and second electrodes; a circuit substrate having a plated through hole in a position to face the through hole, and a circuit section disposed on the reverse surface of the circuit substrate to control the operation of the plurality of first and second electrodes, so that the sensor substrate is placed on the circuit substrate; and a conductive material applied to the inner surfaces of the through hole and the corresponding plated through hole so as to electrically connect the plurality of first and second electrodes and the circuit section.

With this arrangement, it is possible to eliminate the necessity for providing connectors and flexible wiring substrates, which are conventionally required for establishing an electrical connection between the sensor substrate and the circuit substrate. As a result, the thickness of the overall apparatus can be reduced by an amount equal to the thickness of connectors, and also, the overall apparatus can be downsized by an amount equal to flexible wiring substrates that would otherwise project from the lateral sides of the substrates.

According to a further aspect of the present invention, there is provided a method for manufacturing a coordinate input apparatus that comprises a sensor substrate and a circuit substrate, the sensor substrate having a plurality of first electrodes extending in parallel to each other on the obverse surface of a film member, a plurality of second electrodes extending in parallel to each other on the reverse surface of the film member in a direction orthogonal to the plurality of first electrodes, and a through hole disposed at one end of each of the plurality of first and second electrodes, the circuit substrate having a plated through hole in a position to face the through hole, and a circuit section disposed on the reverse surface of the circuit substrate so as to control the operation of the plurality of first and second electrodes, the method comprising the steps of: stacking the circuit substrate on the sensor substrate; printing a conductive material into and around the through hole from the obverse surface of the sensor substrate while suction is applied to the plated through hole from the reverse surface of the circuit substrate; and electrically connecting the plurality of first and second electrodes and the circuit section via the conductive material attached to the inner surface of the through hole and the corresponding plated through hole. This method is employed to allow the conductive material to simply and positively reach the plated through hole, thereby enhancing easy operation of establishing an electrical connection between the sensor substrate and the circuit substrate and also ensuring reliability.

According to a further aspect of the present invention, there is provided a coordinate input apparatus comprising: a sensor substrate having a plurality of first electrodes disposed in parallel to each other on the obverse surface of a film member, and a plurality of second electrodes disposed in parallel to each other on the reverse surface of the film member in a direction orthogonal to the plurality of first electrodes, thereby outputting a value in response to capacitance between the first and second electrodes; a filling layer disposed on the obverse surface of the film member in a region where the plurality of first electrodes are not positioned; and a protective sheet attached to the obverse surface of the filling layer and the plurality of first electrodes so as to come into contact with a position designator, such as a finger or the like, while an operation is performed. A resist layer printed on the sensor substrate may be suitable for the filing layer.

With this construction, recesses formed between the adjacent first electrodes can be filled with the resist layer without any spacing, thereby making it possible to levelling the surface of the sensor substrate, substantially free from undulating portions. It is thus possible to attach the protective sheet onto the substantially flat surface without trapping bubbles on the sensor substrate, which would otherwise cause variations in capacitance. This can also prevent the protective sheet from undulating, thereby ensuring the flatness of the operational surface of the apparatus.

According a further aspect of the present invention, there is provided a coordinate input apparatus comprising a sensor substrate and a protective sheet similar to those described above, and an adhesive layer formed of a cured gel-like adhesive disposed between the protective sheet and the sensor substrate. The gel-like adhesive may preferably be disposed on the reverse surface of the protective sheet that is not yet placed on the sensor substrate.

During the manufacturing process of the coordinate input apparatus described above, the gel-like adhesive intervening between the sensor substrate and the protective sheet placed on the sensor substrate is easily impregnated into the recesses formed in the obverse surface of the sensor substrate without impairing the protective sheet. In this aspect of the present invention, as well as the previous aspect of the present invention, this gel-like adhesive is cured to prevent the trapping of bubbles on the sensor substrate, which would otherwise cause variations in capacitance. This can also avoid the surface of the protective sheet from undulating, thereby maintaining the operational surface flat.

DESCRIPTION OF THE PREFERRED EMBODIMENTS

Embodiments of the present invention will now be described with reference to the drawings.

Figure 1:
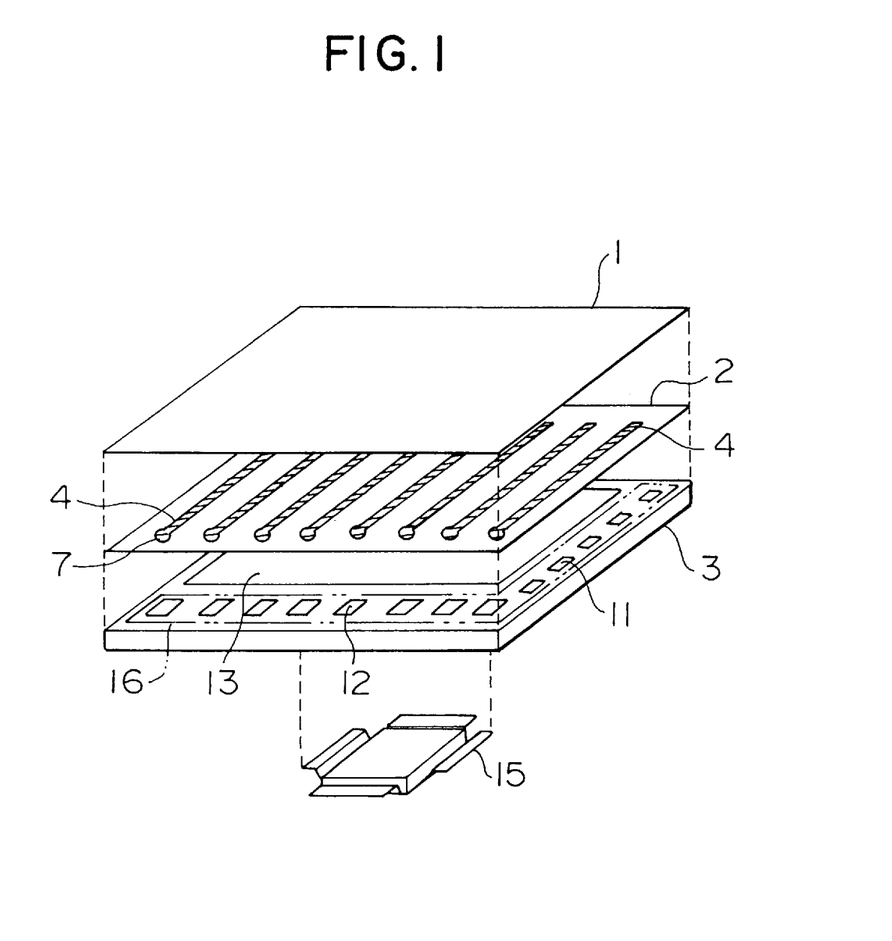
FIG. 1 is an exploded perspective view of the schematic construction of a coordinate input apparatus according to a first embodiment of the present invention.
Figure 2:
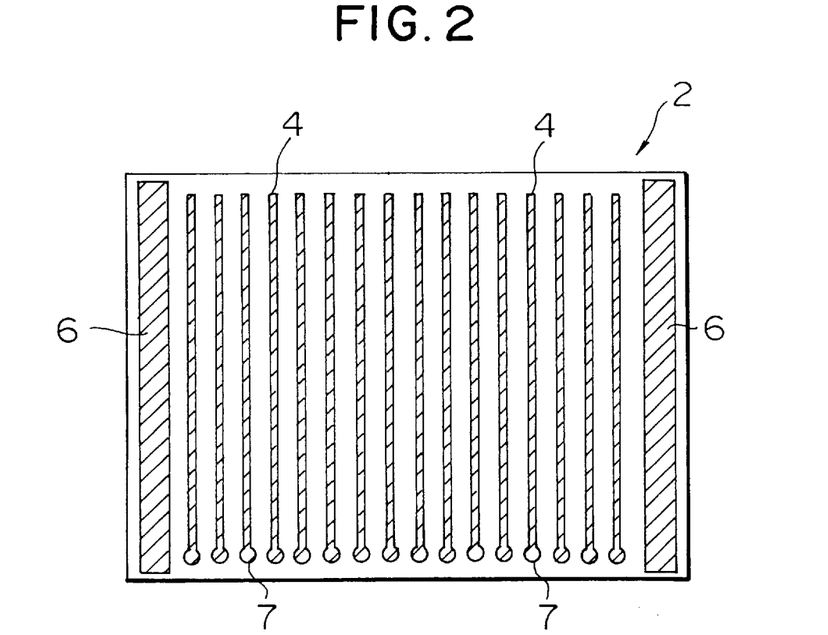
FIG. 2 is an elevational view of a film substrate provided for the coordinate input apparatus shown in FIG. 1.
Figure 3:
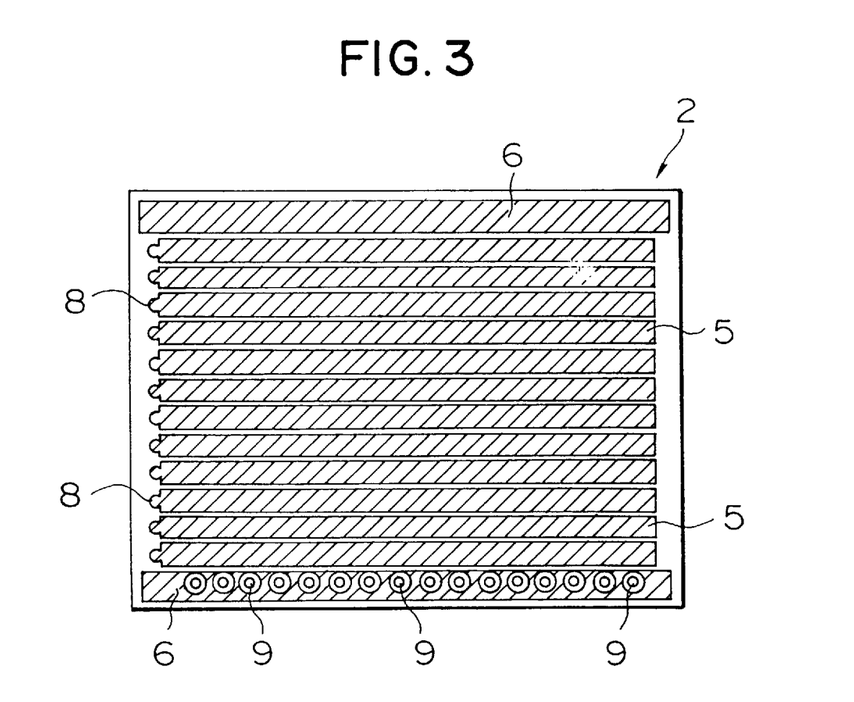
FIG. 3 is a bottom view of the film substrate.
Figure 4:
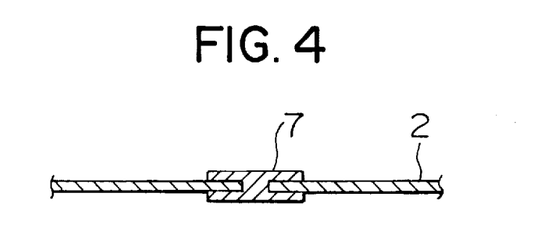
FIG. 4 is a longitudinal sectional view of a through hole formed in the film substrate.
Figure 5:
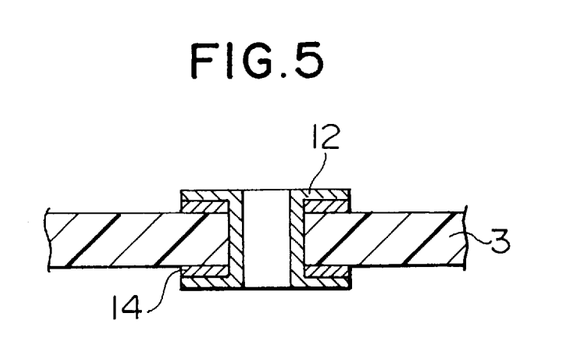
FIG. 5 is a longitudinal sectional view of a through hole formed in a circuit substrate provided for the coordinate input apparatus shown in FIG. 1.
Figure 6:
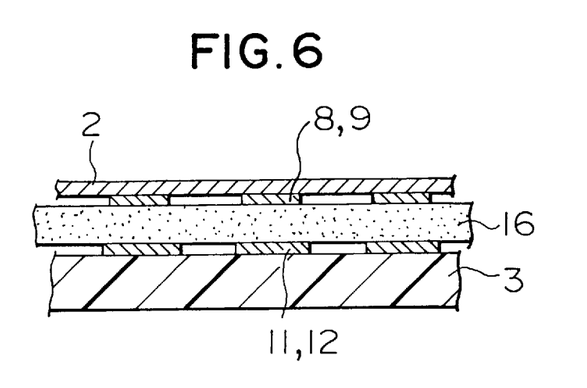
FIG. 6 is a longitudinal sectional view illustrating a connection between the circuit substrate and the film substrate.

FIG. 1 is an exploded perspective view of the schematic construction of a coordinate input apparatus according to a first embodiment of the present invention. FIG. 2 is an elevational view of a film sensor substrate provided for the coordinate input apparatus shown in FIG. 1. FIG. 3 is a bottom view of the film sensor substrate shown in FIG. 2. FIG. 4 is a longitudinal sectional view of a through hole formed in the film sensor substrate. FIG. 5 is a longitudinal sectional view of a through hole formed in a circuit substrate provided for the coordinate input apparatus shown in FIG. 1. FIG. 6 is a longitudinal sectional view illustrating the connecting state between the circuit substrate and the film sensor substrate.

The coordinate input apparatus according to the first embodiment comprises a protective sheet 1 formed of polyethylene terephthalate (PET) film or the like and located at the uppermost portion of the apparatus, a film sensor substrate 2 formed of PET film or the like and disposed below the protective sheet 1, and a circuit substrate 3 placed below the film sensor substrate 2. The surface of the protective sheet 1 serves as the operational surface with which a position designator, such as a finger or the like, comes into contact.

The film sensor substrate 2, which is a dielectric substrate, has, as shown in FIGS. 2 and 3, a plurality of X electrodes 4 at its obverse surface and a plurality of Y electrodes 5 at its reverse surface, both the electrodes 4 and 5 being located at regular intervals. The X electrodes 4 are formed as thin as possible for improving resolution, while the Y electrodes 5 are made as thick as possible for reliably detecting that the Y electrode 5 is touched with a finger. The X electrodes 4 and the Y electrodes 5 extend orthogonal to each other, and are formed in a matrix, as viewed from the top. The electrodes 4 and 5 are formed of, for example, a silver paste printed on the obverse and reverse surfaces of the film substrate 2. For stabilizing the performance of the peripheral portions of the apparatus, bar-like ground conductors 6 are disposed across each array of the X and Y electrodes 4 and 5 in a direction in parallel to the arrangement of each of the X and Y electrodes 4 and 5. A first through hole 7 is formed at the same end of each of the X electrodes 4, and a first land 8 is formed at the same end of each of the Y electrodes 5. Further, second lands 9 are disposed within one of the ground conductors 6 on the reverse surface of the film substrate 2 and are electrically connected to the X electrodes 4 via the first through holes 7.

Second through holes 11 are formed at one edge of the circuit substrate 3 to opposedly face the first lands 8 provided for the film substrate 2, while third through holes 12 are disposed at another edge adjacent to the abovementioned edge to opposedly face the second lands 9. Disposed at the center of the obverse surface of the circuit substrate 3 is a ground portion 13 formed of copper foil or the like, thereby preventing the entry of signals transmitted from the portion below the circuit. substrate 3 to the X and Y electrodes 4 and 5. A wiring pattern 14 formed of copper foil or the like (the overall construction of the pattern is not shown) is arranged on the reverse surface of the circuit substrate 3. Soldered to the wiring pattern 14 is an integrated circuit chip 15 including a drive circuit, a control circuit and the like. Also, the second and third through holes 11 and 12 are connected to land portions of the wiring pattern 14. The first lands 8 and the second through holes 11 are electrically connected to each other, while the second lands 9 and the third through holes 12 are electrically connected to each other, for example, as shown in FIG. 6, across an anisotropic conductive sheet 16 intervening between the film substrate 2 and the circuit substrate 3. In place of the conductive sheet 16, conductive adhesive or conductive paste may be used to bond the substrates 2 and 3.

In the coordinate input apparatus constructed as described above, the film substrate 2 with the obverse surface facing upward is overlaid and attached with pressure onto the circuit substrate 3 with the conductive sheet 16 mounted on the second and third through holes 11 and 12. This electrically connects the first and second lands 8 and 9 disposed on the film substrate 2 and the second and third through holes 11 and 12 formed in the circuit substrate 3, respectively, across the conductive sheet 16. Accordingly, outputs of the respective X electrodes 4 can be transmitted to the corresponding second lands 9 disposed on the reverse surface of the film substrate 2 via the first through holes 7 and further to the wiring pattern 14 mounted on the reverse surface of the circuit substrate 3 via the associated third through holes 12. Similarly, outputs of the respective Y electrodes 5 can be transmitted to the wiring pattern 14 from the corresponding first lands 8 via the second through holes 11 of the circuit substrate 3. In this manner, the film substrate 2 can be simply placed on the top surface of the circuit substrate 3 to establish an electrical connection therebetween. This further eliminates the need for the provision of flexible wiring substrates and connectors, which are conventionally used for establishing an electrical connection between the film substrate 2 and the circuit 3, which would otherwise cause flexible wiring substrates to project from the lateral sides of the substrates 2 and 3. As a result, both the thickness and the external dimensions of the overall coordinate input apparatus can be decreased.

Figure 7:
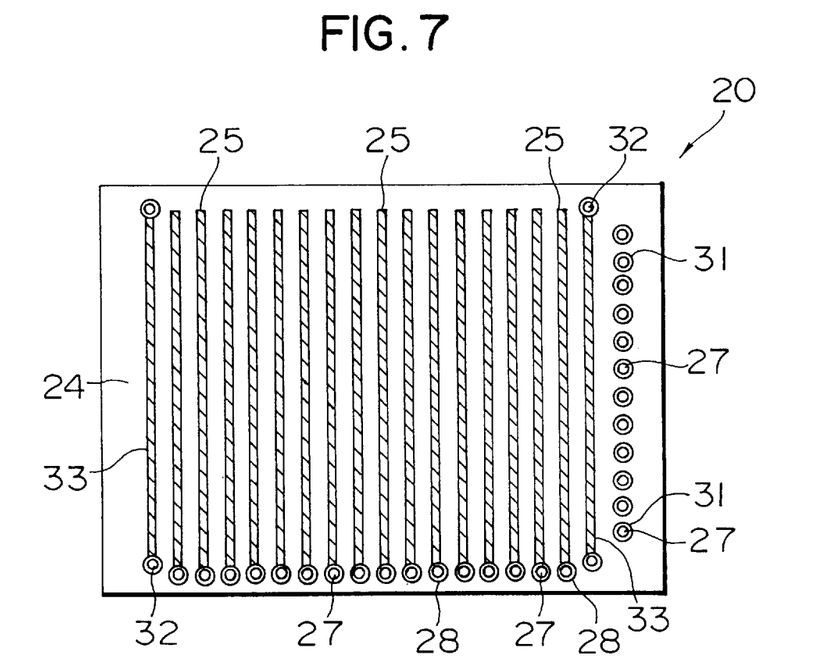
FIG. 7 is an elevational view of a sensor substrate integrated into a coordinate input apparatus according to a second embodiment of the present invention.
Figure 8:
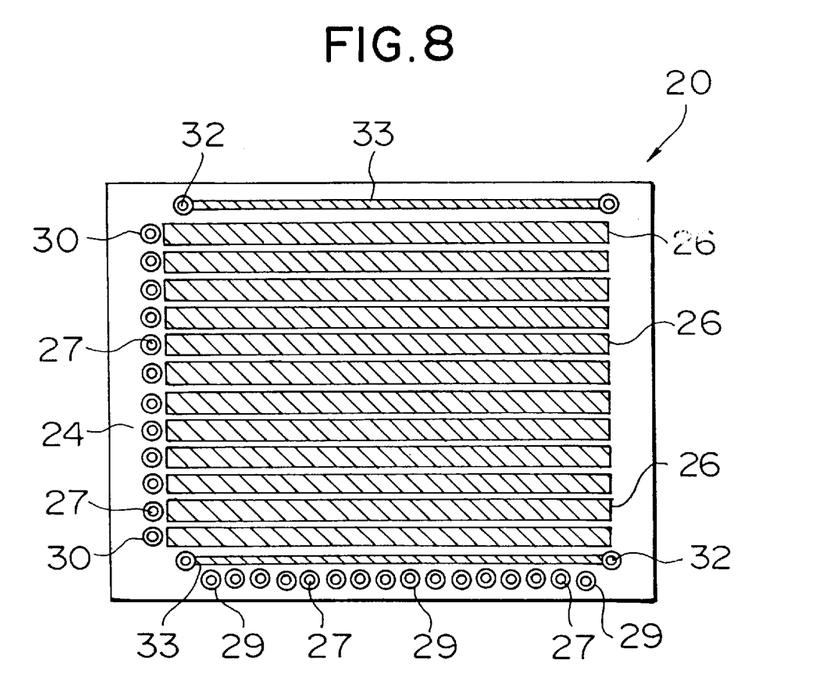
FIG. 8 is a bottom view of the sensor substrate.
Figure 9:
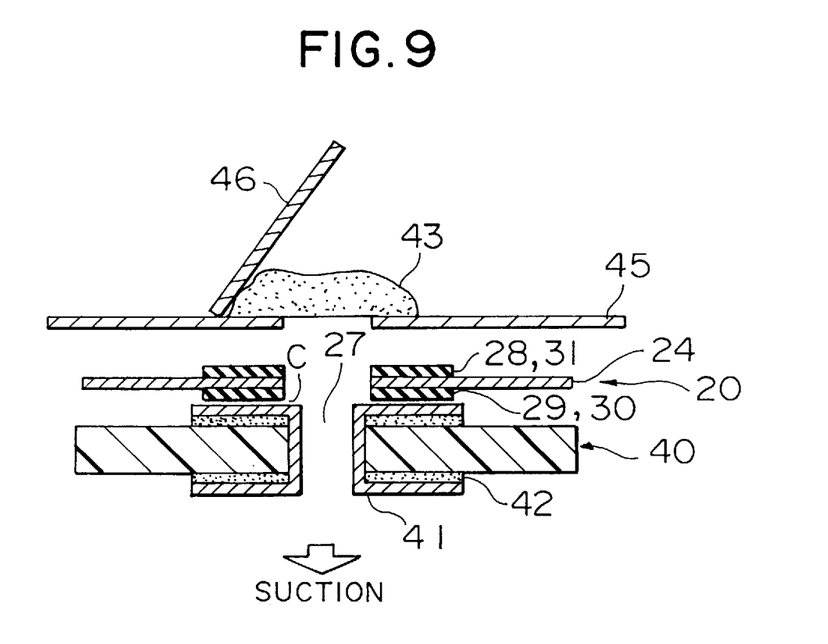
FIG. 9 illustrates a method for printing a conductive material used for electrically connecting the sensor substrate and the circuit substrate.
Figure 10:
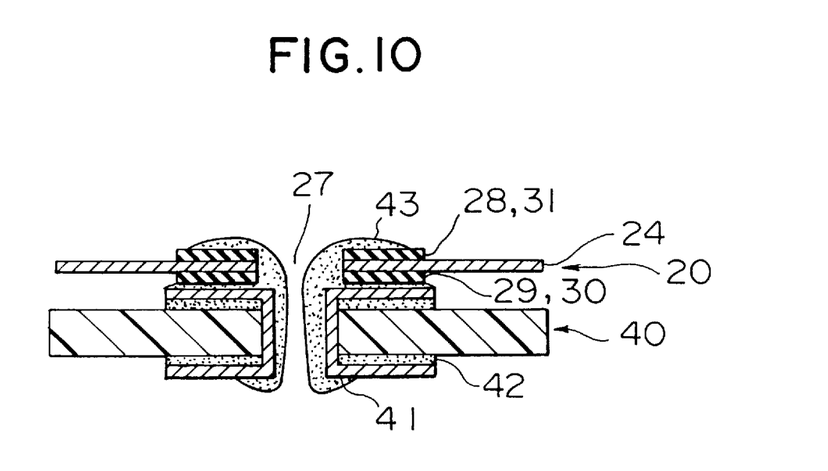
FIG. 10 illustrates the establishment of the electrical connection between the sensor substrate and the circuit substrate after the conductive material has been applied.

An explanation will now be given of a second embodiment of the present invention with reference to the drawings. FIG. 7 is an elevational view of a sensor substrate built into a coordinate input apparatus according to the second embodiment. FIG. 8 is a bottom view of the sensor substrate shown in FIG. 7. FIG. 9 illustrates a method for printing a conductive material used for electrically connecting the sensor substrate and a circuit substrate. FIG. 10 illustrates the establishment of the electrical connection between the sensor substrate and the circuit substrate after the conductive material has been applied.

A sensor substrate 20 is primarily formed of a rectangular film member 24, such as PET film or the like, and has, as illustrated in FIGS. 7 and 8, a plurality of X electrodes 25 and a plurality of Y electrodes 26 extending in the X and Y directions on the obverse and reverse surfaces, respectively, of the film member 24. The X and Y electrode arrays 25 and 26 are arranged in a matrix, as viewed from the top. A through hole 27 is provided at the same end of each of the X electrodes 25, and a through hole 27 is also provided at the same end of each of the Y electrodes 26. Further, disposed on the obverse surface of the film member 24 is a first land 28 positioned at the same end of each of the X electrodes 25, and also, arranged on the reverse surface of the film member 24 is a second land 29 positioned below each first land 28. Moreover, formed on the reverse surface of the film member 24 is a third land 30 located at the same end of each of the Y electrodes 26, and also, provided for the obverse surface of the film member 24 is a fourth land 31 positioned above each third land 30. All the lands 28 through 30 are disposed to surround the corresponding through holes 27. Additionally, for decreasing the adverse influence of noise, bar-like ground conductors 33, each having through holes 32 at both ends, are disposed on the obverse surface of the film member 24 across the X electrode array 25, and bar-like ground conductors 33 are also arranged on the reverse surface thereof across the Y electrode array 26.

On the other hand, formed in a circuit substrate 40 are plated through holes 41 to opposedly face the respective through holes 27 provided for the film member 24. A ground portion formed of copper foil or the like is disposed at the center of the obverse surface of the circuit substrate 40 in order to avoid the entry of noise travelling from the portion below the substrate 40 to the X and Y electrodes 25 and 26. Also, mounted on the reverse surface of the circuit substrate 40 are a wiring pattern 42 formed of copper foil or the like (the overall construction of the pattern 42 is not illustrated) and an integrated circuit chip soldered to the wiring pattern 42 to control the operation of the X and Y electrodes 25 and 26. The lands of the wiring pattern 42 are fit to the plated through holes 41 provided for the circuit substrate 40 (FIGS. 9 and 10). In this embodiment, the internal diameter of the through hole 27 is formed greater than that of the associated plated through hole 41.

As shown in FIG. 10, a conductive material 43 formed of a carbon paste, a silver paste, or the like, is applied to the lands 28 through 31 and to the inside portions of the through holes 27 and the plated through holes 41, both of which holes form an opening passing through the sensor substrate 20 and the circuit substrate 40. The X and Y electrodes 25 and 26 can be electrically connected to the wiring pattern 42 through this conductive material 43.

In a manufacturing process for the coordinate input apparatus constructed as described above, in this embodiment, the conductive material 43 is applied to the predetermined portions by the following procedure. After the sensor substrate 20 has been located and attached onto the circuit substrate 40, as illustrated in FIG. 9, the conductive material 43 is screen-printed on and around the through hole 27 from the obverse surface of the sensor substrate 20 with the use of a print plate 45 and a squeegee 46, while applying suction to the plated through hole 41 from the reverse surface of the circuit substrate 40. This makes it possible to ensure the positive application of the conductive material 43 to the inner portions of the through hole 27 and the plated through hole 41, both of which holes 27 and 41 form an opening passing through the sensor substrate 20 and the circuit substrate 40. The conductive material 43 is also positively applied to the first land 28 formed at one end of each of the X electrodes 25 and the third land 30 formed at one end of each of the Y electrodes 26. As a result, the X and Y electrodes 25 and 26 can be reliably connected electrically to the wiring pattern 42 and the circuit chip mounted on the reverse surface of the circuit substrate 40.

For performing the above-described application, as in this embodiment, if the internal diameter of the through hole 27 is formed greater than that of the corresponding plated through hole 41, the conductive material 43 can be impregnated into a clearance between the reverse surface of the sensor substrate 20 and the obverse surface of the circuit substrate 40, i.e., a clearance C between the second land 29 or the third land 30 and the top level of the plated through hole 41 (FIG. 9), because the clearance is evacuated due to a capillary action and a suction operation. This further enhances the positive electrical connection between the sensor substrate 20 and the circuit substrate 40.

In this fashion, in the coordinate input apparatus of this embodiment, the conductive material 43 is applied to the opening formed by overlaying the through hole 27 of the sensor substrate 20 on the plated through hole 41 of the circuit substrate 40, thereby electrically connecting the X and Y electrodes 25 and 26 to the wiring pattern 42 and the circuit chip mounted on the circuit substrate 40. This obviates the need for the provision of connectors and flexible wiring substrates, which are conventionally required for an electrical connection between the sensor substrate and the circuit substrate. As a consequence, the thickness of the overall apparatus can be decreased by an amount equal to the thickness of connectors, and also, the overall apparatus can be downsized by an amount equal to flexible wiring substrates that would otherwise project from the lateral sides of the sensor substrate and the circuit substrate. Additionally, in this embodiment, suction is applied to the plated through hole 41 from the reverse surface of the circuit substrate 40 during the screen-printing of the conductive material 43. This enables the conductive material 43 printed on the obverse surface of the sensor substrate 20 to readily and reliably reach the plated through hole 41. In this manner, an electrical connection between the sensor substrate 20 and the circuit substrate 40 can be easily achieved, and the reliability of the apparatus can also be enhanced.

As an example of modifications of the above-described embodiment, the through holes 27 disposed at the ends of the respective X and Y electrodes 25 and 26 may communicate with each other so that a generally L-shaped slit, as viewed from the top, including numerous through holes 27 can be formed on the sensor substrate 20. If the conductive material 43 impregnated into the through hole 27 is completely applied up to the reverse surface of the circuit substrate 40, the metal portion plated on the inner surface of the through hole 41 can be safely omitted.

Figure 11:
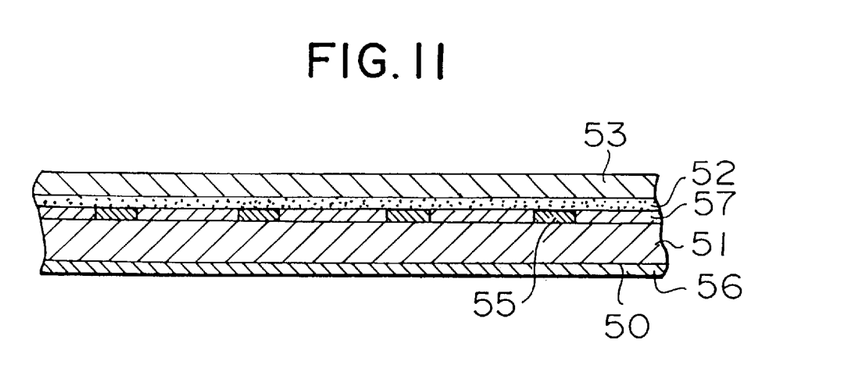
FIG. 11 is a sectional view of the essential portion of a coordinate input apparatus according to a third embodiment of the present invention.
Figure 12:
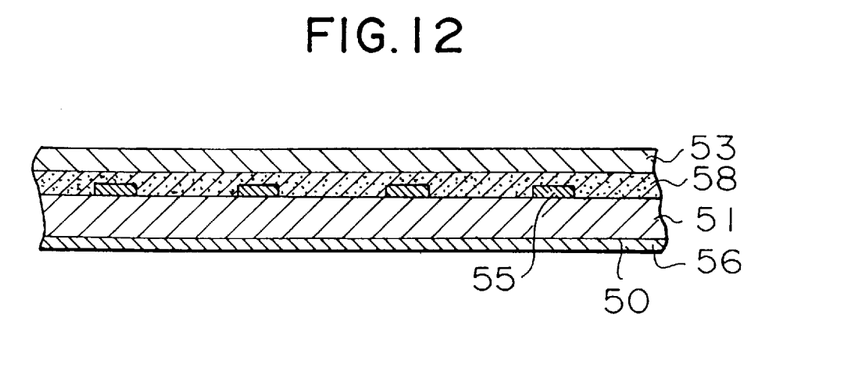
FIG. 12 is a sectional view of the essential portion of an example of modifications of the third embodiment of the present invention.

A third embodiment will now be described with reference to the drawings. FIG. 11 is a sectional view of the essential portion of a coordinate input apparatus according to the third embodiment. The apparatus is schematically constructed by the following manner. A sensor substrate 51 primarily formed of a dielectric rectangular film member 50 is placed on a circuit substrate (not shown). After a resist layer 57 which completely fills recesses without any spacing is printed on the sensor substrate 51, a protective sheet 53 formed of PET film or the like is attached onto the resist layer 57. Disposed on the obverse and reverse surfaces of the film member 50 of the sensor substrate 51 are a plurality of X electrodes 55 and a plurality of Y electrodes 56 extending in parallel to each other in the X and Y directions, respectively. The resist layer 57, formed of, for example, an epoxy resin, a polyester resin, or an ultraviolet (UV) resin, has a thickness substantially equivalent to the X electrodes 55 and formed on the film member 50 other than where the X electrodes 55 are located. An adhesive layer 52 has been disposed on the reverse surface of the protective sheet 53. This adhesive layer 52 is in intimate contact with the obverse surfaces of the resist layer 57 and the X electrodes 55, whereby the protective sheet 53 can adhere to the sensor substrate 51. The surface of the protective sheet 53 serves as the operational surface with which a position designator, such as a finger or the like, comes into contact.

In the coordinate input apparatus constructed as described above, the recesses formed between the adjacent X electrodes 55 on the film member 50 are filled with the resist layer 57 having a thickness equivalent to the X electrodes 55, thereby levelling the surface of the sensor substrate 51 provided with the resist layer 57, substantially free from the undulating portions. Accordingly, the adhesive layer 52 mounted on the reverse surface of the protective sheet 53 is placed and attached with pressure onto the substantially levelled surface of the sensor substrate 51. The protective sheet 53 can thus adhere onto the sensor substrate 51 without trapping bubbles on the substrate 51, which would otherwise cause variations in the capacitance caused by numerous irregularly-shaped bubbles. This can also prevent the surface of the protective sheet 53 from undulating, thereby ensuring the flatness of the operational surface of the apparatus.

As will be clearly understood from the foregoing description, the coordinate input apparatus of the present invention offers the following advantages.

According to one aspect of the present invention, the first electrode array disposed on the obverse surface of the film sensor substrate is communicated to the second land section formed on the reverse surface of the sensor substrate via the through holes provided for the electrode array. Thus, outputs of the first electrode array, as well as outputs of the second electrode array disposed on the reverse surface of the sensor substrate, can be transmitted to the circuit substrate through its reverse surface. This can simplify the structure of the film sensor substrate and further provide a slimmer and smaller coordinate input apparatus.

Also, a wiring pattern to be connected to the first and second land sections formed on the sensor substrate is mounted on the circuit substrate disposed adjacent to the reverse surface of the film sensor substrate. With this arrangement, the sensor substrate can be merely placed on the circuit substrate to electrically connect the two electrode arrays on the sensor substrate to the circuit substrate.

Further, the first electrode array mounted on the obverse surface of the sensor substrate is communicated to the reverse surface thereof via the associated through holes. Thus, the first electrode array, as well as the second electrode array disposed on the reverse surface of the sensor substrate, can be connected to the wiring pattern on the circuit substrate via a connecting member. This can establish a simple and secure connection between the film sensor substrate and circuit substrate, and also provides a slimmer and smaller coordinate input apparatus.

According to another aspect of the present invention, the electrode arrays disposed on the sensor substrate are electrically connected to the circuit mounted on the reverse surface of the circuit substrate by the application of a conductive material to the through holes provided for the sensor substrate and the corresponding plated through holes formed in the circuit substrate. This can eliminate the need for the provision of connectors and flexible wiring substrates, which are conventionally used for establishing an electrical connection between the sensor substrate and the circuit substrate. As a consequence, the thickness of the overall apparatus can be decreased by an amount equal to the thickness of connectors, and also, the overall apparatus can be downsized by an amount equal to flexible wiring substrates that would otherwise project from the lateral sides of the sensor substrate and the circuit substrate.

If the internal diameter of the through hole is formed greater than that of the corresponding plated through hole, the conductive material can be impregnated into a clearance between the holes, since the clearance is evacuated due to a capillary action and a suction operation. This further enhances the reliability of the electrical connection between the sensor substrate and the circuit substrate.

As a method for applying the conductive material, the conductive material is printed on the sensor substrate while suction is applied to the plated through hole from the reverse surface of the circuit substrate. This enables the conductive material to simply and positively reach the plated through hole, thereby enhancing easy operation of establishing an electrical connection between the sensor substrate and the circuit substrate and also ensuring reliability.

According to a further aspect of the present invention, a filling layer, such as a resist layer, is disposed on the surface of the sensor substrate, except in the portion where the electrode array is mounted. It is thus possible to attach a protective sheet onto the surface of the sensor substrate without trapping bubbles on the substrate, which would otherwise cause variations in the capacitance due to numerous irregularly-shaped bubbles. This can also avoid the protective sheet from undulating so as to ensure the flatness of the operational surface of the apparatus, thereby guaranteeing good operational performance of the apparatus. Instead of the provision of the filling layer on the sensor substrate, a gel-like adhesive may be disposed and cured between the sensor substrate and the protective sheet, in which case, similar advantages can be obtained.

What is claimed is:

1. A coordinate input apparatus including a film sensor that comprises:
   a first electrode array having a plurality of electrodes disposed in parallel to each other on the obverse surface of said film sensor;
   a through hole section disposed at one end of said first electrode array;
   a second electrode array having a plurality of electrodes disposed in parallel to each other on the reverse surface of said film sensor in a direction orthogonal to said first electrode array;
   a first land section disposed at one end of said second electrode array; and
   a second land section electrically connected to said through hole section.

2. A coordinate input apparatus according to claim 1, further comprising a circuit substrate having a wiring pattern to be connected to said first and second land sections, wherein said film sensor is placed on said circuit substrate.

3. A coordinate input apparatus comprising:
   a dielectric substrate including a first electrode array that has a plurality of electrodes disposed in parallel to each other on the obverse surface of said dielectric substrate, a second electrode array that has a plurality of electrodes disposed in parallel to each other on the reverse surface of said dielectric substrate in a direction orthogonal to said first electrode array, and a first through hole section disposed at one end of said first electrode array;
   a circuit substrate disposed adjacent to the reverse surface of said dielectric substrate, including a second through hole section positioned opposedly to face said first through hole section, a third through hole section located opposedly to face one end of said second electrode array, and a wiring pattern and a drive circuit disposed on the reverse surface of said circuit substrate and connected to said second and third through hole sections; and
   a connecting member for electrically connecting said first and second through hole sections and also electrically connecting said second electrode array and said third through hole section.

4. A coordinate input apparatus comprising:
   a sensor substrate having a plurality of first electrodes disposed in parallel to each other on the obverse surface of said sensor substrate, a plurality of second electrodes disposed in parallel to each other on the reverse surface of said sensor substrate in a direction orthogonal to said plurality of first electrodes, and a through hole disposed at one end of each of said plurality of first and second electrodes;
   a circuit substrate having a plated through hole in a position to face said through hole, and a circuit section disposed on the reverse surface of said circuit substrate to control the operation of said plurality of first and second electrodes, said sensor substrate being placed on said circuit substrate; and
   a conductive material applied to the inner surfaces of said through hole and the corresponding plated through hole so as to electrically connect said plurality of first and second electrodes to said circuit section.

5. A coordinate input apparatus according to claim 4, wherein the internal diameter of said through hole is formed greater than the internal diameter of the corresponding plated through hole.

6. A coordinate input apparatus according to claim 4, wherein each of said through holes, each formed at one end of each of said plurality of first and second electrodes, are communicated with each other to form a generally L-shaped slit.

7. A method for manufacturing a coordinate input apparatus that comprises a sensor substrate and a circuit substrate, said sensor substrate having a plurality of first electrodes extending in parallel to each other on the obverse surface of a film member, a plurality of second electrodes extending in parallel to each other on the reverse surface of said film member in a direction orthogonal to said plurality of first electrodes, and a through hole disposed at one end of each of said plurality of first and second electrodes, said circuit substrate having a plated through hole in a position to face said through hole, and a circuit section disposed on the reverse surface of said circuit substrate so as to control the operation of said plurality of first and second electrodes, said method comprising:
   stacking said circuit substrate on said sensor substrate;
   printing a conductive material into and around said through hole from the obverse surface of said sensor substrate; and
   electrically connecting said plurality of first and second electrodes to said circuit section via said conductive material attached to the inner surfaces of said through hole and the corresponding plated through hole.

8. A coordinate input apparatus comprising:
   a sensor substrate having a plurality of first electrodes disposed in parallel to each other on the obverse surface of a film member, and a plurality of second electrodes disposed in parallel to each other on the reverse surface of said film member in a direction orthogonal to said plurality of first electrodes, thereby outputting a value in response to capacitance between said first and second electrodes;
   a filling layer disposed on the obverse surface of said film member in a region where said plurality of first electrodes are not positioned; and a protective sheet attached to the obverse surface of said filling layer and said plurality of first electrodes so as to be contacted by a position designator when an operation is performed.

9. A coordinate input apparatus according to claim 8, wherein said filling layer comprises a resist layer printed on said sensor substrate.

10. A coordinate input apparatus comprising:

a sensor substrate having a plurality of first electrodes disposed in parallel to each other on the obverse surface of a film member, and a plurality of second electrodes disposed in parallel to each other on the reverse surface of said film member in a direction orthogonal to said plurality of first electrodes, thereby outputting a value in response to capacitance between said first and second electrodes;

a protective sheet placed on said sensor substrate so as to be contacted by a position designator when an operation is performed; and an adhesive layer formed of a cured gel-like adhesive disposed between said protective sheet and said sensor substrate.

11. A coordinate input apparatus according to claim 10, wherein said gel-like adhesive is applied to the reverse surface of said protective sheet that is not yet placed on said sensor substrate.

12. A coordinate input apparatus comprising:

a dielectric film substrate that includes a first electrode array having a plurality of electrodes disposed in parallel to each other on the obverse surface of said dielectric film substrate, and a second electrode array having a plurality of electrodes disposed in parallel to each other on the reverse surface of said dielectric film substrate in a direction orthogonal to said first electrode array;

a circuit substrate disposed adjacent to the reverse surface of said film substrate and having a drive circuit on the reverse surface of said circuit substrate; and a protective sheet disposed adjacent to the obverse surface of said film substrate, whereby said apparatus detects a change in capacitance between said first and second electrode arrays so as to calculate a position designated by a position designator.

13. The method of claim 7 further including, when printing a conductive material, applying suction to said plated through hole from the reverse surface of said circuit substrate.

14. The coordinate input apparatus of claim 12 wherein electrodes of such second electrode array have a width greater than the width of the electrodes of said first electrode array.

* * * * *